United States Patent [19]
Koyama

[11] Patent Number: 5,981,377
[45] Date of Patent: Nov. 9, 1999

[54] SEMICONDUCTOR DEVICE WITH IMPROVED TRENCH INTERCONNECTED TO CONNECTION PLUG MATING AND METHOD OF MAKING SAME

[75] Inventor: Kazuhide Koyama, Kanagawa, Japan

[73] Assignee: Sony Corporation, Tokyo, Japan

[21] Appl. No.: 09/032,038

[22] Filed: Feb. 27, 1998

[30] Foreign Application Priority Data

Feb. 28, 1997 [JP] Japan .................................. 9-061846

[51] Int. Cl.⁶ .................................................. H01L 21/44
[52] U.S. Cl. ........................ 438/633; 438/653; 438/666; 438/675; 438/763
[58] Field of Search ..................................... 438/667, 622, 438/624, 634, 638, 652, 675, 637, 625, 653, 761, 791, 666, 668, 700, 629, 633, 763

[56] References Cited

U.S. PATENT DOCUMENTS

| | | | |
|---|---|---|---|
| 4,789,648 | 12/1988 | Chow et al. .............................. | 438/225 |
| 5,244,837 | 9/1993 | Dennison ................................. | 438/195 |
| 5,354,711 | 10/1994 | Heitzmann et al. ..................... | 438/182 |
| 5,433,650 | 7/1995 | Winebarger ................................ | 451/6 |
| 5,464,794 | 11/1995 | Lur et al. ................................. | 438/187 |
| 5,578,523 | 11/1996 | Fiodalice et al. ........................ | 438/190 |
| 5,612,254 | 3/1997 | Mu et al. ................................. | 438/195 |
| 5,679,608 | 10/1997 | Cheung et al. .......................... | 438/195 |
| 5,767,582 | 6/1998 | Lee et al. ................................. | 257/753 |
| 5,801,094 | 9/1998 | Yew et al. ................................ | 438/624 |
| 5,840,624 | 11/1998 | Jang et al. ............................... | 438/624 |
| 5,851,915 | 12/1998 | Miyakawa ................................ | 438/622 |
| 5,869,393 | 2/1999 | Tseng ...................................... | 438/622 |

*Primary Examiner*—Wael M. Fahmy
*Assistant Examiner*—Kurt Eaton
*Attorney, Agent, or Firm*—Hill & Simpson

[57] ABSTRACT

Disclosed is a semiconductor device having a structure in which even if a misalignment occurs an upper trench and a connection hole, that is, the upper trench is offset from the connection hole, it is possible to suppress a reduction in contact area between an interconnection material and a connection hole burying material and hence to reduce an increase in contact resistance, and which is particularly suitable for a borderless trench interconnection structure, and a method of fabricating the semiconductor device. The semiconductor device includes: a substrate; an interlayer insulating film formed on the substrate; a connection hole formed in the interlayer insulating film; a connection plug formed by burying the connection hole with a connection hole burying material; a trench formed in the interlayer insulating film; and a trench interconnection formed by burying the trench with an interconnection material. In such a semiconductor device, the connection plug enters in the trench interconnection in such a manner that at least part of a side surface of sid connection plug is brought in contact with the trench interconnection.

10 Claims, 10 Drawing Sheets

F I G. 10A
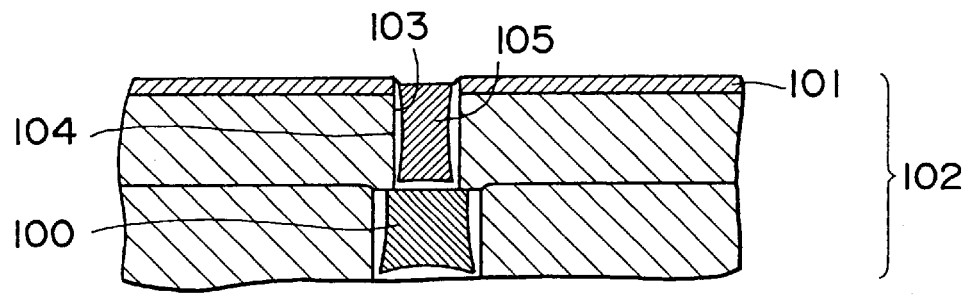
F I G. 10B
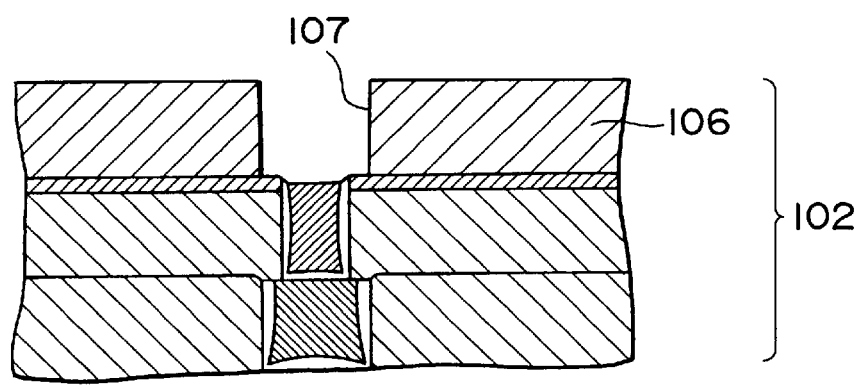
F I G. 10C
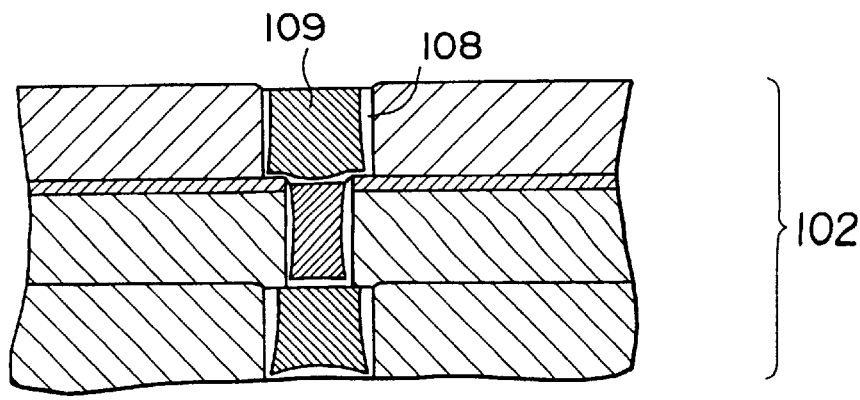

SEMICONDUCTOR DEVICE WITH IMPROVED TRENCH INTERCONNECTED TO CONNECTION PLUG MATING AND METHOD OF MAKING SAME

BACKGROUND OF THE INVENTION

The present invention relates to a method of fabricating a semiconductor device having a trench interconnection structure.

With a tendency toward higher integration of semiconductor devices, a dimensional rule of inner interconnections becomes finer, and thereby line widths of inner interconnections and spaces therebetween become narrower. However, to guarantee a reliability of interconnections, especially, a resistance against electromigration, cross-sections of interconnections must be ensured, with a result that thicknesses of interconnection layers cannot be thinned so much. As a result, an aspect ratio (ratio of height/width) of each of an interconnection portion and a space portion becomes higher. For this reason, a related art interconnection process comes to require a technique for processing interconnections finer and thicker than conventional ones and also to require a technique for burying narrower and deeper spaces with insulating films.

With respect to the former technique, however, since multi-layerization of Al based interconnections is progressed, it becomes difficult to process the Al alloy based interconnections into rectangular shapes. Also, with respect to Cu based interconnections expected to be preferentially used in the future from the viewpoints of improvement in reliability of interconnection and reduction in resistance of interconnection, there are various problems in terms of a technique of processing Cu based interconnections, and consequently, it seems that a Cu based interconnection is very difficult to be formed as an interconnection with a high aspect ratio.

Besides, the latter technique has been realized using a bias ECR (Electron Cyclotron Resonance)-CVD process or a SOG (Spin On Glass) etch-back process; however, the above process is complicated, to cause problems that a fabrication cost is increased and a treatment time is made longer. Further, to realize global perfect planarization, it is additionally required to form a dummy interconnection or to polish an insulating film by a CMP (Chemical Mechanical Polish) process, with a result that the process is further complicated.

To solve these problems together, attention has been recently focused on a trench interconnection process shown in FIGS. 6A to 6D. In this process, a patterned resist layer 61 is formed on an insulating film 60 containing an etching stopper layer 60a (FIG. 6A). A trench 62 for forming a trench interconnection is formed by etching the insulating film 60 using the resist layer 61 as an etching mask, and then the resist layer 61 is removed (FIG. 6B). A barrier metal layer 63 is formed over the entire surface of the insulating film 60 and an interconnection material 64 is formed to bury the trench 62 therewith (FIG. 6C). The interconnection material 64 is removed by CMP or the like except for part of the interconnection material 64 buried in the trench 62, to form a trench interconnection 65 (FIG. 6D).

The use of such a trench interconnection process is expected to solve the various problems accompanied by the above-described tendency toward finer-geometries. This is because if an insulating film is planarized by CMP once, it is possible to eliminate planarization of an interlayer insulating film formed thereafter, as a general rule; it is also possible to eliminate burying a narrow space with an interlayer insulating film; and further, it is possible to eliminate fine processing (lithography and etching) for an interconnection material. The use of the trench interconnection process having the above advantages, however, further requires development of the process techniques shown in the following terms (1) to (3):

(1) a technique for forming a fine trench in an insulating film;

(2) a technique for burying a trench with an interconnection material to form a trench interconnection; and (3) a technique for removing an interconnection material deposited on portions other than a trench.

With respect to the technique shown in (1), a process of forming a fine trench in an insulating film can is very easier than a process of forming a fine interconnection from a layer of an interconnection material. With respect to the techniques shown in (2) and (3), for either an Al interconnection or a Cu interconnection, an attempt has been made to combine a reflow process or a high pressure reflow process with the CMP process; or to combine the CVD process with the CMP process. Here, the reflow process is carried out by forming a film of an interconnection material such as an Al alloy, heating the film at a temperature in a range of a re-crystallization temperature to a melting point of the material to soften the material thereby increasing a fluidity of the material, and making the material reflow in a trench or a connection hole previously formed with a barrier metal (TiN/Ti) layer, thereby burying the trench or connection hole with the interconnection material. The high pressure reflow process is carried out by heating an interconnection material in a high pressure inert gas atmosphere, thereby making the interconnection material reflow in a trench or a connection hole previously formed with a barrier metal layer (which process is similar to a hot extrusion process).

In particular, from the viewpoints of workability of Cu and/or use of an organic based low dielectric constant material as an insulating material, the trench interconnection process, which is out of fine processing of an interconnection material itself and planarization of the buried insulating film, has a large merit, and therefore, the trench interconnection process is expected to be preferentially used in the future.

Further, there is known a duel damascene interconnection technique which is developed from the above-described trench interconnection process. This technique will be described with reference to FIGS. 7A to 7C. First, both a connection hole (contact hole or via-hole) 71 and a trench 72 are formed in an interlayer insulating film 70 containing an etching stopper layer 70a (FIG. 7A). Then, a barrier metal layer 73 is formed over the entire surface of the interlayer insulating film 70, and the connection hole 71 and the trench 72 are simultaneously buried with an interconnection material 74 (FIG. 7B). Next, the interconnection material 74 is removed by CMP except for part of the interconnection material 74 buried in the trench 72, to form a connection plug 75 and a trench interconnection 76 at a time (FIG. 7C). If such a dual damascene interconnection technique can be applied to a mass-production process of semiconductor devices, it is possible to form both a connection hole and an interconnection pattern at a time, and hence to significantly reduce the process cost and shorten the treatment time. To be applied to a mass-production process of semiconductor devices, however, this technique is required to mainly solve subjects shown in the following terms (4) and (5):

(4) a technique for forming a narrow and deep (aspect ratio: high) connection hole and a trench; and (5) a technique for simultaneously burying a narrow and deep (aspect ratio: high) connection hole and a trench with an interconnection material.

In particular, with respect to the subject (5), a related art reflow process is insufficient, and an ability of burying a trench with an interconnection material must be further enhanced. Further, even in the case of the CVD process having a high burying ability, the CVD technique itself for depositing Al and Cu is required to be further enhanced. To be more specific, at present, the duel damascene process cannot be applied to fabrication of semiconductor devices, unless in the case of the Al-CVD, problems such as surface coarsening, film formation rate, resistivity, and doping of an impurity are solved, and in the case of the Cu-CVD, in addition to the above problems, various problems regarding a CVD system such as re-depositi on of Cu, cleaning, and generation of dust are solved.

Accordingly, in the case of development of a trench interconnection process, an attempt has been made to practically use a related art trench interconnection process in combination of a CVD-W (tungsten) plug technique known to be excellent in burying ability rather than application of the duel damascene process.

Incidentally, with a tendency toward a finer dimensional rule of interconnections, areas of fine connection holes at lithography and etching steps become one of factors of restricting a reduction in area of the total cell. Further, in consideration of a misalignment at the lithography step, according to a related art structure, as shown in FIG. 8, a margin 83 of typically about 0.1 $\mu$m is given to an interconnection pattern 82 at a connection hole 81 portion. As a result, there arises a problem that it is difficult to reduce a pitch of interconnections.

In recent years, a so-called borderless connection hole-interconnection structure is being examined, in which a misalignment margin is omitted from an interconnection pattern. With this structure, as shown in FIG. 9, a pitch of interconnections can be further reduced correspondingly to elimination of such a misalignment margin. Such a structure is expected to become an important technique in the future, particularly, for interconnections low in current density in cell, although there is a problem in terms of a reliability (degradation of a resistance against electromigration upon occurrence of a misalignment, or the like).

Accordingly, such a borderless connection hole-interconnection structure should be realized for a trench interconnection process using the CVD-W plug technique.

Incidentally, the trench interconnection process combined with the CVD-W plug technique generally used as a connection hole burying process is generally carried out in accordance with a process sequence shown in FIGS. 10A to (A) A lower trench interconnection 100 is formed, and an interlayer insulating film 102 having on its surface an etching stopper layer 101 is formed. A connection hole 103 is formed in the interlayer insulating film 102; an adhesive layer 104 is formed in the connection hole 103, and a W plug 105 is formed in the connection hole 103 (FIG. 10A).

(B) An additional insulating film 106 is further formed, and a trench 107 for forming an upper interconnection is formed (FIG. 10B).

(C) A backing film 108 is formed in the trench 106, and the trench 106 is buried with an interconnection material, to form an upper trench interconnection 109 (FIG. 10C).

In the trench interconnection process using such a CVD-W plug technique, however, if a borderless connection hole-interconnection structure is adopted without provision of a misalignment margin for the upper trench interconnection, there arises the following problem:

That is, as shown in FIG. 11A, in the case of a misalignment of a connection hole 103 to a lower trench interconnection 100, since the connection hole 103 is formed in such a manner as to be engraved along a side surface of the lower trench 100 by over-etching, a contact area between the lower trench 100 and a W plug 105 os not significantly reduced, so that a contact resistance therebetween is not significantly increased. On the other hand, as shown in FIG. 11B, a misalignment of an upper trench interconnection 109 to the connection hole 103 directly exerts an effect on a reduction in contact area therebetween, thereby seriously increasing a contact resistance therebetween.

SUMMARY OF THE INVENTION

An object of the present invention is to provide a semiconductor device having a structure in which even if a misalignment occurs an upper trench and a connection hole, that is, the upper trench is offset from the connection hole, it is possible to suppress a reduction in contact area between an interconnection material and a connection hole burying material and hence to reduce an increase in contact resistance, and which is particularly suitable for a borderless trench interconnection structure, and to provide a method of fabricating the semiconductor device by making use of a trench interconnection process.

The present inventor has found that the above object can be achieved by provision of a structure in which a connection plug enters in an upper trench interconnection in such a manner that even a side surface of the connection plug is brought in contact with the upper trench interconnection, and accomplished the present invention.

According to a first aspect of the present invention, there is provided a semiconductor device including:
- a substrate;
- an interlayer insulating film formed on the substrate;
- a connection hole formed in the interlayer insulating film;
- a connection plug formed by burying the connection hole with a connection hole burying material;
- a trench formed in the interlayer insulating film; and
- a trench interconnection formed by burying the trench with an interconnection material;
- wherein the connection plug enters in the trench interconnection in such a manner that at least part of a side surface of sid connection plug is brought in contact with the trench interconnection.

According to a second aspect of the present invention, there is provided a method of fabricating a semiconductor device, including:
- a step (a) of forming an insulating film on a substrate;
- a step (b) of forming a connection hole in the insulating film;
- a step (c) of burying the connection hole with a connection hole burying material to form a connection plug;
- a step (d) of forming a trench in the insulating film; and
- a step (e) of burying the trench with an interconnection material to form a trench interconnection;
- wherein the formation of the trench in the step (d) is performed in such a manner that at least part of a side wall of the connection plug buried in the connection hole is exposed in the trench.

According to a third aspect of the present invention, there is provided a method of fabricating a semiconductor device, including:

a step (A) of forming a first insulating film on a substrate;

a step (B) of forming a connection hole in the insulating film;

a step (C) of burying the connection hole with a connection hole burying material to form a connection plug;

a step (D) of additionally forming a second insulating film on the first insulating film;

a step (E) of forming a trench in the second insulating film and the first insulating film; and a step (F) of burying the trench with an interconnection material to form a trench interconnection;

wherein the formation of the trench at the step (E) is performed in such a manner that at least part of a side wall of the connection plug buried in the connection hole at the step (D) is exposed in the trench.

According to the present invention, it is possible to provide a semiconductor device having a structure in which even if a misalignment occurs an upper trench and a connection hole, that is, the upper trench is offset from the connection hole, it is possible to suppress a reduction in contact area between an interconnection material and a connection hole burying material and hence to reduce an increase in contact resistance, and which is particularly suitable for a borderless trench interconnection structure, and to provide a method of fabricating the semiconductor device.

BRIEF DESCRIPTION OF THE DRAWINGS

FIGS. 1A and 1B are views of a structure of a semiconductor device of the present invention, wherein FIG. 1A shows a state before a trench is buried with an interconnection material, and FIG. 1B shows a state after the trench is buried with the interconnection material;

FIGS. 10A to 10C are views showing sequential steps of a usual trench interconnection process combined with a general tungsten plug; and FIGS. 11A and 11B are views of a structure of a semiconductor device, wherein FIG. 11A shows a state in which a misalignment occurs between a lower trench interconnection in a trench and a connection hole, and FIG. 11B shows a state in which a misalignment occurs between an upper trench interconnection in a trench and a connection hole.

DETAILED DESCRIPTION OF THE PREFERRED EMBODIMENTS

Hereinafter, embodiments of the present invention will be described in detail with reference to the accompanying drawings.

Figure 1A:
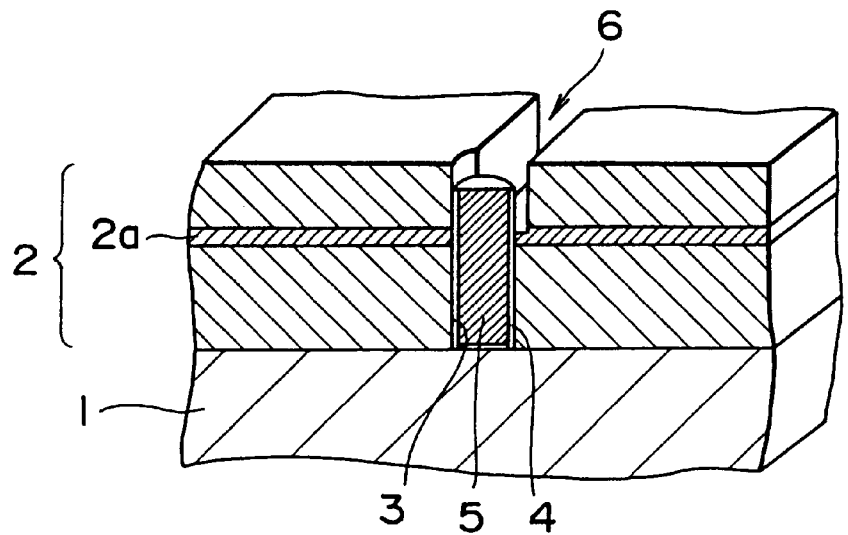
Figure 1B:
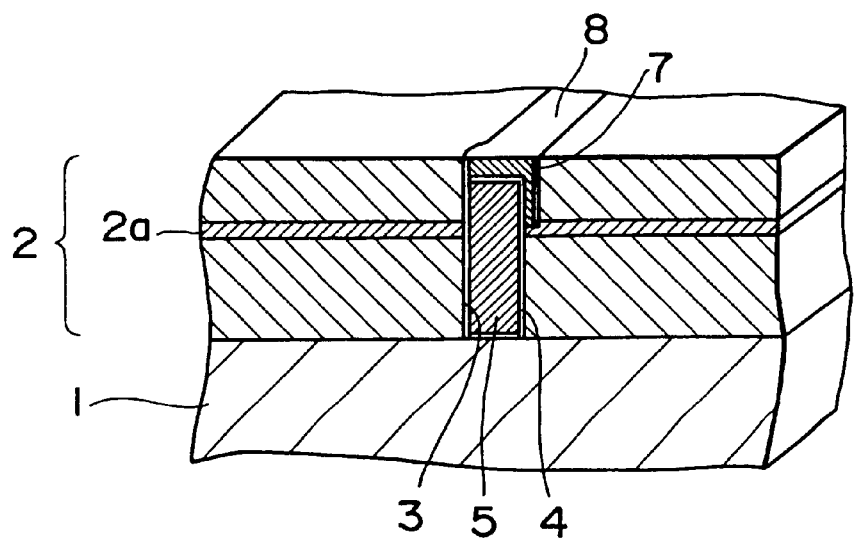

FIGS. 1A and 1B show a relationship between a connection hole and an upper trench interconnection in a semiconductor device of the present invention, wherein FIG. 1A is a view showing a state before a trench is buried with an interconnection material, and FIG. 1B is a view showing a state after the trench is buried with the interconnection material to form a trench interconnection.

A semiconductor device of the present invention in the state before a trench is buried with an interconnection material has the following structure. An interlayer insulating film 2 (for example, $SiO_2$ layer) having as an inner layer an etching stopper layer 2a (for example, SiN layer) is formed on a substrate 1, and a connection hole 3 is formed in the interlayer insulating film 2. A backing film 4 is formed in the connection hole 3, and the connection hole 3 is buried with a connection hole burying material, to form a connection plug 5. A trench 6 is formed in a portion, of the interlayer insulating film 2, positioned on an upper side of the connection plug 5. In this semiconductor device, a backing layer 7 such as a TiN/Ti layer is formed in the trench 6, and the trench 6 is buried with an interconnection material such as Cu, to form a trench interconnection 8 (see FIG. 1B).

In the semiconductor device of the present invention, as shown in FIG. 1A, an upper portion of the connection plug 5 extends into the trench 6 so that at least part of a side surface of the upper portion of the connection plug 5 is brought in contact with the trench interconnection. Accordingly, as shown in FIG. 1B, the connection plug 5 enters in the trench interconnection 8 so that the side surface of the connection plug 5 can be also brought in contact with the trench interconnection 8. With this structure, even if a misalignment occurs between the connection plug 5 and the trench interconnection 8, that is, part of the trench interconnection 8 is offset from the connection plug 5, it is possible to suppress a reduction in contact area therebetween, and hence to suppress an increase in contact resistance therebetween. The semiconductor device of the present invention, therefore, is allowed to exhibit a higher integration and a higher reliability than those of the related art semiconductor device.

With this structure, if the connection plug 5 passes through the trench interconnection 8 and reaches a surface thereof, it is possible to ensure sufficient contact between the connection plug 5 and the trench interconnection 8.

In addition, as components such as materials of respective layers constituting the semiconductor device of the present invention, there may be used known materials.

For example, as the substrate 1, there may be exemplified a transistor element, an isolation region, an insulating film formed on a transistor element, or a lower interconnection layer.

As the interlayer insulating film 2, there may be used a single film made from a material selected from silicates as known insulating materials, and organic low dielectric constant materials each having a thermal resistance withstanding the maximum process temperature, or used a multi-layered film containing a plurality of the above materials. Here, examples of the silicates include $SiO_2$, BPSG (Boro-Phospho Silicate Glass), PSG (Phospho Silicate Glass), BSG (Boro-Silicate Glass), AsSG (Arsenic Silicate Glass), NSG (Nondoped Silicate Glass), SOG, LTO (Low Temperature Oxide), SiN, SiON and SiOF; and examples of the organic low dielectric constant materials include amorphous teflon (polytetrafluoroethylene), BCB (benzocyclobuthene), Parylene, and Flare (fluorinated aryl ether).

Examples of interconnection materials each being used for burying the trench 6 to form the trench interconnection 8 may include pure Al; aluminum based alloys such as Al—Cu, Al—Si, Al—Si—Cu, Al—Ge, Al—Si—Ge, Al—Ge—Cu, Al—Cu—Ti, Al—Si—Ti, Al—Se, and Al—Se—Cu; pure Cu; Cu based alloys such as Cu—Ti and Cu—Zr; and Ag.

As each of the backing films 4 and 7, there may be used a single film made from a material selected from high melting point metals such as Ti, TiN, TiON, W, WN, TiW, TiWN, Ta, and TaN, and compounds thereof; or used a multi-layered film containing a plurality of the above materials.

As a connection hole burying material, there may used the above interconnection material used for forming the trench interconnection 8, a high melting point metal such as tungsten, or a compound thereof. These materials can be used in the form of a multi-layered film. In particular, it is desired to use a CVD-W plug formed by a blanket (Blk) CVD-W burying process excellent in burying characteristic. The CVD-W plug may be replaced with a plug using Al, particularly, a CVD-Al plug excellent in burying characteristic. Such a CVD-Al plug can be formed only in the connection hole 3 by a combination of the Blk-CVD technique and an etch-back technique, or by a selective CVD technique, and accordingly, there little occurs a problem regarding surface coarsening and film quality.

Hereinafter, one preferred embodiment of the above-described method of fabricating a semiconductor device according to the present invention will be fully described in the order of the following steps (a) to (e) with reference to FIGS. 2A to 2E.

Step (a)

Figure 2A:
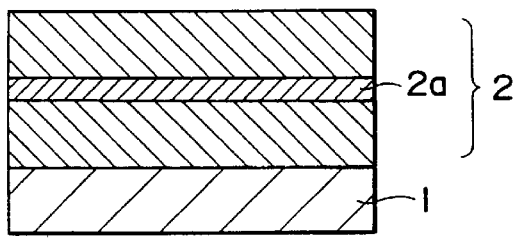
FIGS. 2A to 2E are views illustrating sequential steps of a method of fabricating a semiconductor device of the present invention.

First, an insulating film 2 as an interlayer insulating film is formed on a substrate 1 (FIG. 2A). In this case, the thickness of the insulating film 2 is preferably set at a value sufficient to form a connection hole and a trench in the insulating film 2. The insulating film 2 may be of a single layer structure; however, it is preferably configured to contain an etching stopper layer 2a acting as an etching stopper upon formation of a trench in the subsequent step (d). That is, the insulating film 2 is preferably of a multi-layered structure containing the etching stopper layer 2a. Each of the insulating film and etching stopper layer may be formed from a known material by a known process.

Step (b)

Figure 2B:
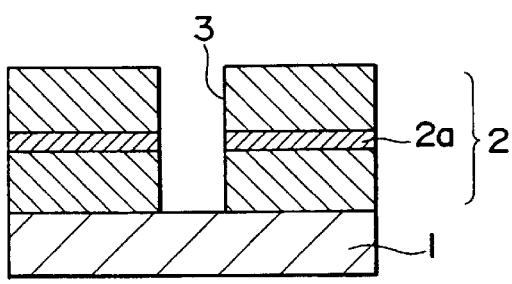

A connection hole 3 is formed in the insulating film 2 using known lithography and etching techniques (FIG. 2B).

Step (c)

Figure 2C:
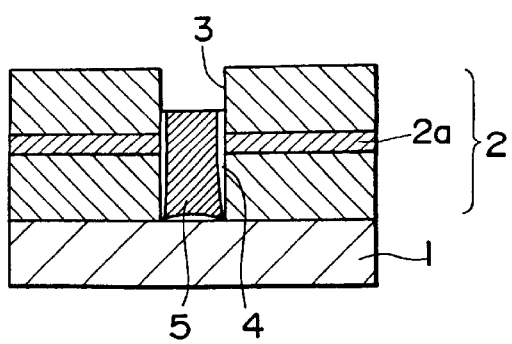

A backing film 4 as a barrier metal layer is formed in the connection hole 3 thus formed as needed, and the connection hole 3 is buried with a connection hole burying material, to form a connection plug 5 (FIG. 2C). At this time, it is desired that an upper portion of the connection plug 5 is positioned between the etching stopper layer 2a and a surface of the insulating film 2, so that when a trench is formed in the subsequent step (d), part of a side wall of the connection plug 5 can be easily exposed in the trench.

Step (d)

Next, a trench 6 is formed in the insulating film 2 (FIG. 2D) in such a manner that at least part of the side wall of the connection plug buried in the connection hole is exposed in the trench 6. To be more specific, as described at Step (c), the upper portion of the connection plug 5 is positioned between the etching stopper 2a and the surface of the insulating film 2, and in such a state, the trench 6 is formed so as to reach the etching stopper 2a.

In the case where the etching stopper 2a is not provided, the depth of the trench 6 may be adjusted by control of an etching time.

Step (e)

Figure 2D:
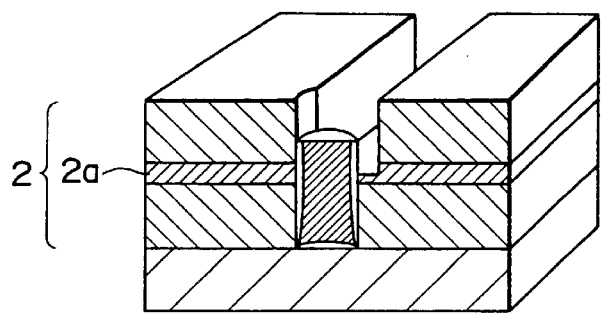
Figure 2E:
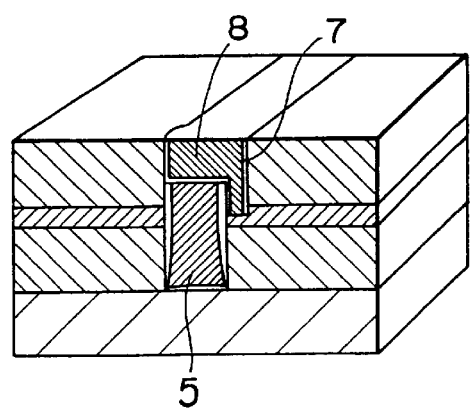

After a backing film 7 as a barrier metal layer is formed in the trench 6 thus formed as needed, and the trench 6 is buried with an interconnection material, to form a trench interconnection 8 (FIG. 2E). A semiconductor device of the present invention is thus obtained. In this fabrication method, since the upper portion of the connection plug 5 enters in the trench interconnection 8, a side surface of the connection plug 5 can be also brought in contact with the trench interconnection 8. As a result, even if a misalignment occurs between the connection plug 5 and the trench interconnection 8, that is, the trench interconnection 8 is offset from the connection plug 5, it is possible to suppress a reduction in contact area therebetween, and hence to reduce an increase in contact resistance therebetween. Accordingly, the semiconductor device obtained by the fabrication method of the present invention is allowed to exhibit a higher integration and a higher reliability than those of the related art semiconductor device.

Incidentally, in the structure shown in FIGS. 2A to 2E, the thickness of the insulating film 2 is set to be equivalent to a total of thicknesses of the connection plug 5 and the trench interconnection 8. However, in the case where it is difficult to bury a fine connection hole 3 having a high aspect ratio with a connection hole burying material, it is desired that after the connection plug 5 is formed at Step (c), the insulating film 2 is added with an insulating film such that the combined insulating film has a total thickness sufficient to form the trench 6 in the combined insulating film, and then the trench 6 is formed in the combined insulating film at Step (d). Such an embodiment will be described with reference to FIGS. 3A to 3F.

Step (A)

Figure 3A:
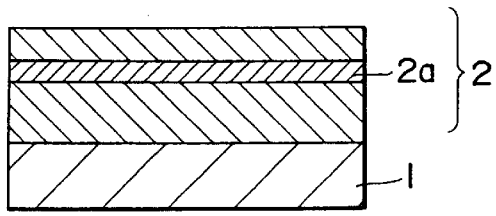
FIGS. 3A to 3F are views illustrating sequential steps of another method of fabricating a semiconductor device of the present invention.

Like Step (a) shown in FIG. 2A, an insulating film 2 as an interlayer insulating film is formed on a substrate 1 (FIG. 3A). At this time, the thickness of the insulating film 2 is preferably set at a value sufficient to form a connection hole 3 in the insulating film 2 but insufficient to form a trench 6 therein (that is, the thickness of a portion of the insulating film over an etching stopper 2a is thinned). Of course, the etching stopper 2a may be not provided.

Step (B)

Figure 3B:
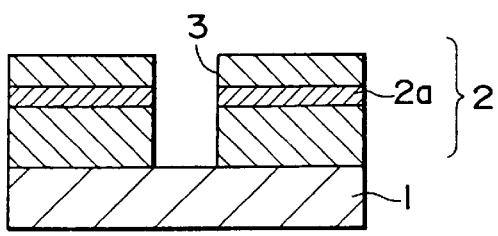

Next, like Step (b) shown in FIG. 2B, a connection hole 3 is formed in the insulating film 2 (FIG. 3B).

Step (C)

Figure 3C:
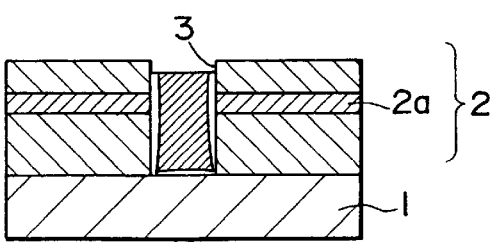

Like Step 2(c) shown in FIG. 2C, a backing film 4 as a barrier metal layer is formed in the connection hole 3 thus formed as needed, and the connection hole 3 is buried with a connection hole burying material, to form a connection plug 5 (FIG. 3C).

Step (D)

Figure 3D:
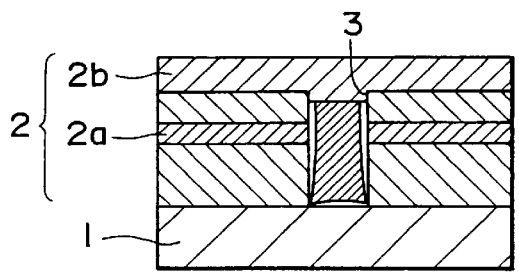
Figure 3E:
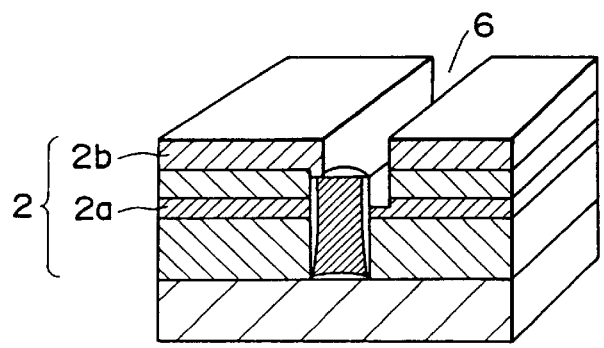

Next, an insulating film 2b is additionally formed on the insulating film 2 (FIG. 3D). The reason why the insulating film 2b is additionally formed is that the total thickness of the insulating film 2 including the additionally formed insulating film 2b is sufficient to form a trench 6 therein.

Step (E)

Next, like Step (d) shown in FIG. 2D, a trench 6 is formed in the insulating film 2 including the additionally formed insulating film 2b in such a manner that at least part of a side wall of the connection plug 5 buried in the connection hole 3 is exposed in the trench 6.

Step (F)

Figure 3F:
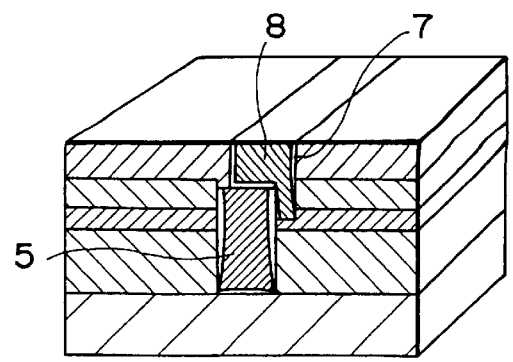

Like Step (e) shown in FIG. 2E, a backing film 7 as a barrier metal layer is formed in the trench 6 thus formed as needed, and the trench 6 is buried with an interconnection material, to form a trench interconnection 8 (FIG. 3F). A semiconductor device of the present invention is thus obtained.

The present invention will be more clearly understood by way of the following examples:

In addition, in Example 1, a trench interconnection is prepared by forming a contact hole (connection hole) in a diffusion region of a silicon substrate, forming a connection plug by combination of the blanket CVD-W burying technique and etch-back technique, and burying a trench with pure Cu by the reflow technique to form an trench interconnection.

In Example 2 in which an aspect ratio of a connection hole is higher than that in Example 1, a trench interconnection is prepared by forming a via-hole (connection hole) on the upper side of a lower trench interconnection, forming a connection plug by combination of the blanket CVD-W burying technique and etch-back technique, additionally forming an insulating film, forming an upper trench, and burying the upper trench with an Al—Cu alloy by the high pressure reflow technique to form a trench interconnection.

EXAMPLE 1

Figure 4A:
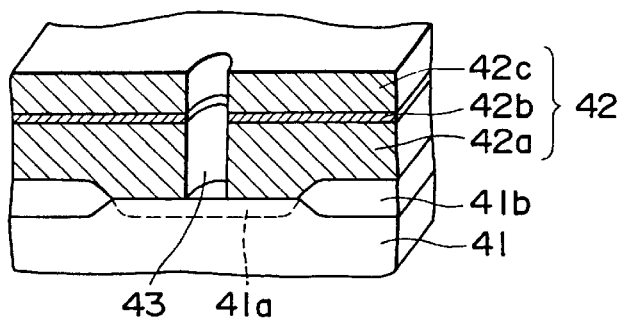
FIGS. 4A to 4E are views showing sequential steps of fabricating a semiconductor device in accordance with Example 1.

(A) (See FIG. 4A)

An insulating film 42a was formed on a silicon substrate 1 having a diffusion region 41a and a LOCOS layer 41b in the diffusion region 41a in accordance with a usual LSI process. A surface of the insulating film 42a was planarized by CMP (Chemical Mechanical Polishing). The thickness of the insulating film 42a after CMP was 0.7 $\mu$m. Such a thickness corresponds to a depth of a contact hole.

As the insulating film 42a, there was used a LP (Low Pressure)-CVD-$SiO_2$ film. The film formation condition and the CMP condition for the LP-CVD-$SiO_2$ film were as follows:

Formation Condition for LP-CVD-$SiO_2$ film
  gas: $SiH_4/O_2/N_2$ =250/250/100 sccm
  pressure: 13.3 Pa
  substrate heating temperature: 420° C.
CMP Condition for $SiO_2$ Film
  polishing pressure: 300 g/$cm^2$
  rotational speed: 30 rpm (polishing plate) 30 rpm (polishing head)
  polishing pad: IC-1000 (trade name)
  slurry: $NH_4OH$ base (containing formed silica)
  flow rate: 100 cc/min
  temperature: 25–30° C.

Next, an etching stopper layer 42b acting for processing a trench (which will be described later) and an insulating film 42c for forming a trench were formed. As the etching stopper layer 42b, a SiN film was formed to a thickness of 100 nm by plasma CVD, and as the insulating film 42c for forming a trench, a $SiO_2$ film was formed to a thickness of 400 nm by plasma CVD using TEOS (Tetra Ethyl Ortho Silicate [Si—(O—$C_2H_5)_4$]).
Plasma CVD Condition for Formation of SiN Film
  gas: $SiH_4/NH_3/N_2$ =180/500/720 sccm
  pressure: 700 Pa
  RF power: 350 W
  substrate heating temperature: 250° C.
Plasma CVD Condition for Formation of TEOS-$SiO_2$ Film
  gas: TEOS =50 sccm
  pressure: 333 Pa
  RF power: 180 W
  substrate heating temperature: 400° C.

Next, a contact hole 43 containing a trench portion (hole diameter: 0.4 $\mu$m, aspect ratio: 3.0) was formed by lithography and etching.

Figure 4B:
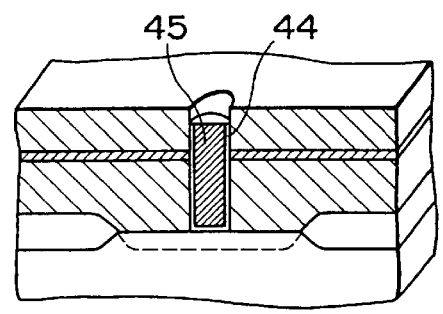

This etching was performed in accordance with the following three steps. At the first step, the TEOS-$SiO_2$ film 42c was etched using the SiN film 42b as an etching stopper; at the second step, the SiN film 42b was etched; and at the third step, the $SiO_2$ film 42a was etched again to the extent that the diffusion layer 1a was exposed, to form the contact hole 43. The conditions of the above etching steps were as follows:
$SiO_2$ Etching Condition at Steps 1 to 3
  gas: $C_4F_8$/CO/Ar=10/100/200 sccm
  pressure: 6 Pa
  RF power: 1600 W
  substrate heating temperature: 20° C.
SiN Etching Condition at Step 2
  (identical to that in Step 1 except for etching gas: $C_4F_8$/CO/$O_2$/Ar=10/100/20/200 sccm)
(B) (See FIG. 4B)

After pre-treatment, a TiN/Ti film (thickness: 40 nm/10 nm) as a backing film 44 (barrier metal) was formed, and a blanket CVD-W film was formed to bury the interior of the contact hole 43, followed by overall etch-back of the W film for perfectly removing the W film and the backing film 44 except for part of the W film and the backing film 44 in the contact hole 43, to form a connection plug 45.

In addition, the etch-back must be performed such that an upper surface of the connection plug 45 is stopped halfway of the insulating film (TEOS-$SiO_2$) 42c.

Figure 4C:
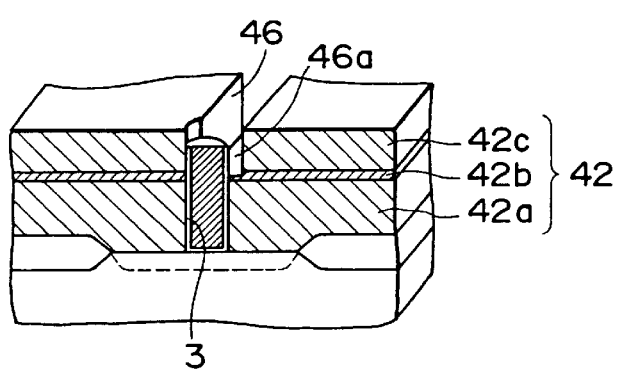

In addition, although the W film can be removed by CMP, it is preferably removed by etch-back because there little presents a plug loss (recess at the upper portion of the connection plug).
ECR-CVD Condition for Formation of Ti Film
  gas: $TiCl_4/H_2$/Ar=3/100/170 sccm
  pressure: 0.23 Pa
  $\mu$-wave: 2,800 W
  substrate heating temperature: 460° C.
ECR-CVD Condition for Formation of TiN Film
  gas: $TiCl_4/H_2/N_2$/Ar=20/26/8/170 sccm
  pressure: 0.23 Pa
  $\mu$-wave: 2,800 W
  substrate heating temperature: 460° C.
Blk-CVD Condition for Formation of W Film
  gas: $WF_6/H_2$/Ar=80/500/2,800 sccm
  pressure: 10,640 Pa
  substrate heating temperature: 430° C.
Etch-back Condition for Blk-W Film
  gas: $SF_6$/Ar=110/90 sccm
  pressure: 35 Pa
  RF power: 275 W
(C) (See FIG. 4C)

Next, an upper trench was formed by lithography and etching. To be more specific, a trench 46 was formed in the same etching condition as that for the insulating film 42c in such a manner as to reach the etching stopper layer 42b.

In this case, to reduce a pitch of interconnections, a margin pattern of interconnections in consideration of a misalignment at the lithography step was not set, that is, a borderless trench interconnection structure was adopted. As a result, the upper trench 46 was partially offset from the contact hole 43, to cause an offset portion 46a. In this example, however, since the connection plug 45 enters in the trench 46, even a side surface of the connection plug 45 can be sufficiently brought in contact with a trench interconnection.

Figure 4D:
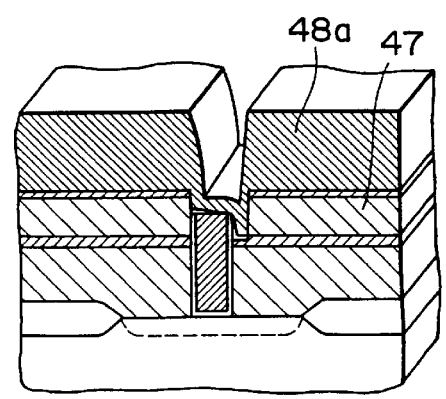

(D) (See FIG. 4D)

After an inner surface of the trench 46 was cleaned by sputter-etching, a TiN/Ti film as a backing film 47 was formed to thicknesses (TiN film: 50 nm, Ti film: 20 nm) by LD sputtering, and a Cu layer 48a was continuously formed to a thickness of 800 nm in vacuum by sputtering. Here, the LD (Long Distance) sputtering process will be briefly described. In the LD sputtering process, a distance between a sputter target and a substrate (wafer) in a sputtering system is set at a value (20 cm or more) which is longer than a distance (about 7 cm) used in a general sputtering process, so that a vertical incident component of sputter particles to the substrate is increased, to thereby improve coverage in a hole or a trench as compared with a general sputtering process. The backing film (TiN/Ti film) formed in the trench 6 at this step does not require such a strict coverage as to be necessary for the backing film 44 (barrier metal) formed in the contact hole 43. For this reason, the backing film (TiN/Ti film) was formed in the trench 6 by the LD sputtering process being inferior in coverage to the CVD process but being simpler than the CVD process.

Cleaning Condition by Sputter-etching
　gas: Ar=100 sccm
　pressure: 0.4 Pa
　etching time: 1 min
　RF bias: 1,000 V
　substrate heating temperature: 200° C.

LD Sputtering Condition for Formation of Ti Film
　gas: Ar=100 sccm
　pressure: 0.4 Pa
　DC power: 6 kW
　substrate heating temperature: 200° C.

LD Sputtering Condition for Formation of TiN Film
　gas: Ar/$N_2$=20/70 sccm
　pressure: 0.4 Pa
　DC power: 12 kW
　substrate heating temperature: 200° C.

Sputtering Condition for Formation of Cu Film
　gas: Ar=100 sccm
　pressure: 0.4 Pa
　DC power: 15 kW
　substrate heating temperature: 200° C.

Figure 4E:
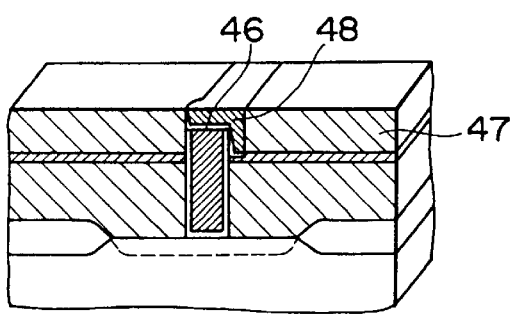

(E) (See FIG. 4E)

The Cu film was then heat-treated in an Ar gas atmosphere at a re-crystallization temperature or more to increase fluidity thereof, thus allowing Cu to reflow in the trench 46. In this case, the heat-treatment may be performed not only in an inert gas atmosphere such as the above Ar gas atmosphere but also in a reducing gas atmosphere. Also, since it takes a long time to carry out reflow of Cu at a relatively low temperature, the devices may be collectively subjected to reflow of Cu in a batch processing manner. Further, reflow of Cu is desired to be continuously performed in vacuum; however, if the device is exposed to atmospheric air once, it may be heat-treated in a reducing atmosphere added with hydrogen or the like to allow Cu to reflow in the trench 6 while reducing an oxide layer on the surface of the Cu film.

Then, the Cu film and TiN/Ti film were perfectly removed by CMP except for part of the Cu film and TiN/Ti film present in the trench 46, to form a trench interconnection 48. Thus, a semiconductor device having a structure shown in FIG. 4E was obtained. In addition, it is desired to cap an upper surface of the trench interconnection 48 made from Cu with a film not containing oxygen such as a SiN film Reflow Condition for Cu
　Ar gas pressure: 0.4 Pa or more
　heating time: 10 min
　substrate heating temperature: 450° C.

CMP Condition for Cu (+TiN/Ti) Film
　polishing pressure: 100 g/$cm^2$
　rotational speed: 30 rpm (polishing plate) 30 rpm (polishing head)
　polishing pad: IC-1000 (trade name)
　slurry: $H_2O_2$ base (containing alumina)
　flow rate: 100 cc/min
　temperature: 25–30° C.

In the semiconductor device thus obtained, even in the case where the trench 46 was partially offset from the contact hole 43, a large increase in contact resistance therebetween could be avoided because the upper and side surfaces of the connection plug 45 buried in the contact hole 43 were in contact with the upper trench interconnection 48.

EXAMPLE 2

Figure 5A:
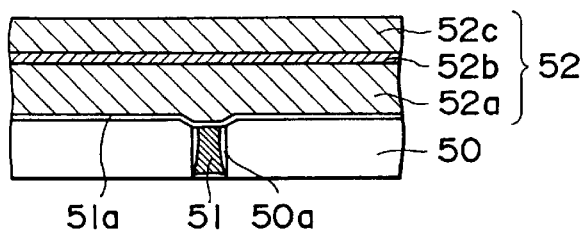
FIGS. 5A to 5F are views showing sequential steps of fabricating a semiconductor device in accordance with Example 2.

(A) (See FIG. 5A)

A lower trench interconnection 51 made from an Al—Cu alloy formed in such a manner as to be surrounded by an insulating film 50 and a backing film 50a by the same procedure as described in Example 1. Next, a SiON film as a reflection preventive film 51a was formed to a thickness of 24 nm by plasma CVD, and a $SiO_2$ film as an insulating film 52a was formed to a thickness of 600 nm by plasma CVD using TEOS [Si-(O-$C_2H_5$)$_4$] (the forming condition is the same as the formation condition for the insulating film 42c in Example 1, except for the film thickness).

ECR Plasma CVD Condition for Formation of SiON Film
　gas: $SiH_4$/$N_2$O=50/25 sccm
　pressure: 330 Pa
　RF power: 800 W
　substrate heating temperature: 360° C.

Next, a SiN film as an etching stopper film 52b was formed to a thickness of 100 nm by plasma CVD, and thereafter, like Example 1, a partial insulating film 52c for forming an upper trench was formed to a thickness of 300 nm.

As will be described later, a diameter of a via-hole to be formed is so small that an aspect ratio of the via-hole becomes very high, and accordingly, if an insulating film for forming an upper trench is entirely formed and the via-hole is buried with a blanket CVD-W film, there possibly remains a void in the via-hole. For this reason, only the partial insulating film 52c (thickness: 300 nm) for forming an upper trench is previously formed and then the remaining insulating film (thickness: 300 nm) is formed after formation of a W plug in the via-hole. This allows the via-hole to be easily buried with the W-film.

Figure 5B:
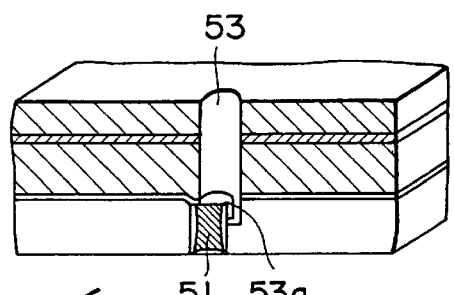

(B) (See FIG. 5B)

Next, a via-hole 53 (hole diameter: 0.3 μm, aspect ratio: 3.3) was formed by lithography and etching. In addition, the etching was performed at three steps, like Example 1.

In this case, to reduce a pitch of interconnections, a margin pattern of interconnections in consideration of a misalignment at the lithography step was not set, that is, a borderless connection hole-interconnect ion structure was adopted. As a result, the via-hole 53 was partially offset from the lower trench interconnection 51, to cause an offset portion 53a; however, since a side surface of the via-hole 53 was in contact with the lower trench interconnection 51, the contact resistance therebetween was not increased.

Figure 5C:
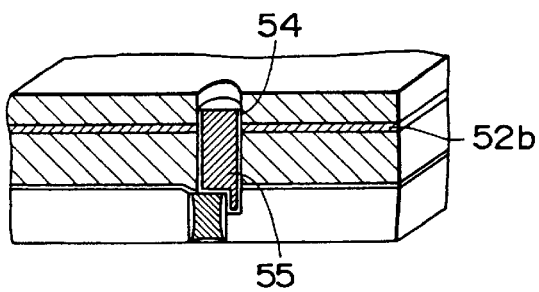

(C) (See FIG. 5C)

After the interior of the via-hole 53 was cleaned by sputter-etching, a TiN/Ti film as a backing film 54 was formed to thicknesses (TiN film: 50 nm, Ti film: 20 nm) by LD sputtering. Then, like Example 1, a blanket CVD-W film was formed to bury the via-hole 53, followed by overall etch-back of the W film for perfectly removing the W film and the lower multi-layered film (TiN/Ti film) except for part of the W film and the lower multi-layered film present in the via-hole 53, to form a connection plug 55. Here, the etch-back of the W film is required to be performed such that an upper surface of the connection plug 55 is positioned halfway of the insulating film (TEOS-SiO$_2$) 52b.

In addition, as described above, even a side wall of the lower trench interconnection 51 is brought in contact with the connection plug 55, if a misalignment occurs therebetween, a large increase in contact resistance therebetween is not observed.

Figure 5D:
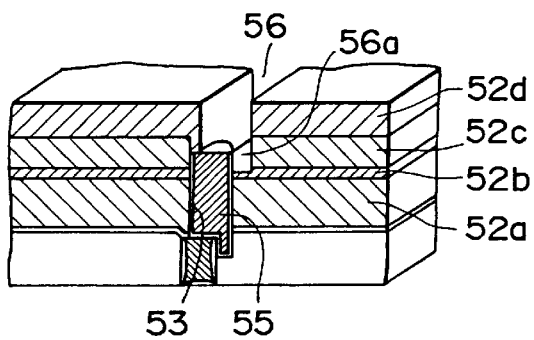

(D) (See FIG. 5D)

Next, to form an upper trench at a desired depth, a SiO$_2$ film as an insulating film 52d was formed to a thickness of 300 nm by plasma CVD using TEOS.

Then, an upper trench 56 was formed to such a depth as to reach the etching stopper layer 52b by lithography and etching. The etching condition was the same as that for the insulating film 42c in Example 1.

In this case, to reduce a pitch of interconnections, a margin pattern of interconnections in consideration of a misalignment at the lithography step was not set, that is, a borderless connection hole-interconnect ion structure was adopted. As a result, the upper trench 56 was partially offset from the via-hole 53, to cause an offset portion 56a. In this example, however, since the connection plug 55 enters in the trench 56, even a side surface of the connection plug 55 can be sufficiently brought in contact with a trench interconnection 58 (which will be described later).

Figure 5E:
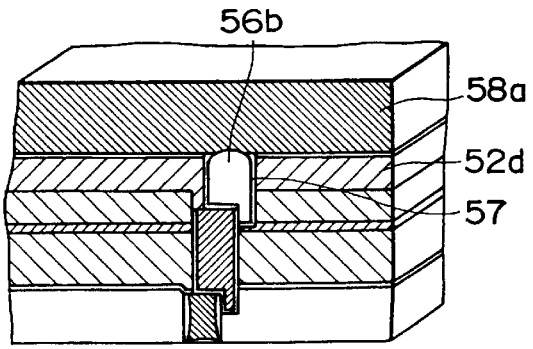

(E) (See FIG. 5E)

After an inner surface of the trench 56 was cleaned by sputter-etching, a TiN/T film as a backing film 57 was formed to thicknesses (TiN film: 50 nm, Ti film: 20 nm) by LD sputtering, and an Al—0.5% Cu alloy layer 58a was continuously formed to a thickness of 800 nm in vacuum by sputtering.

At this time, to efficiently bury the via-hole 53 with the alloy layer 58a by the high pressure reflow process, the alloy layer 58a was formed in such a condition as to easily form a void 56b in the trench 56. To be more specific, since a bridge shape is easy to be obtained by setting the film formation temperature and hence promoting an effect of deforming the film due to surface tension, the film formation temperature for the Al—Cu alloy was set at 400° C.

To bury the via-hole with the Al—Cu alloy by the high pressure reflow process, it is required to suppress oxidation of Al on a side wall of the trench 56. That is, even in the case of using the backing layer (multi-layered metal), a gas (mainly H$_2$O) released from the interlayer insulating film upon high pressure reflow tends to obstruct the burying characteristic of the Al—Cu alloy. As a result, to obtain a stable burying characteristic of the Al—Cu alloy, degassing must be previously performed by setting temperatures upon pre-treatment of the backing film and formation of the multi-layered film at relatively high values. Further, to safely suppress degassing, before the above-described cleaning by sputter-etching, the device may be separately heat-treated at a temperature (for example 500° C.) higher than the temperature upon high pressure reflow of the Al—Cu alloy.

Cleaning Condition by Sputter-etching gas: Ar=100 sccm
pressure: 0.4 Pa
etching time: 1 min
RF bias: 1,000 V
substrate heating temperature: 400° C.

LD Sputtering Condition for Formation of Ti Film gas: Ar=100 sccm
pressure: 0.4 Pa
DC power: 6 kW
substrate heating temperature: 400° C.

LD Sputtering Condition for Formation of TiN Film gas: Ar/N$_2$=20/70 sccm
pressure: 0.4 Pa
DC power: 12 kW
substrate heating temperature: 400° C.

Sputtering Condition for Formation of Al—0.5% Cu Layer gas: Ar=100 sccm
pressure: 0.4 Pa
DC power: 15 kW
substrate heating temperature: 400° C.

Figure 5F:
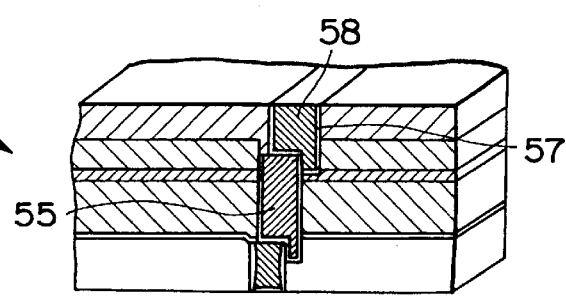
Figure 6A:
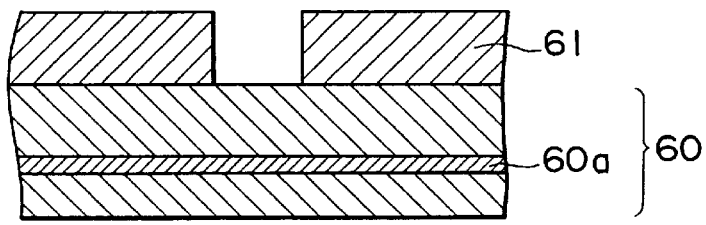
FIGS. 6A to 6D are views showing sequential steps of a general trench interconnection process.
Figure 6B:
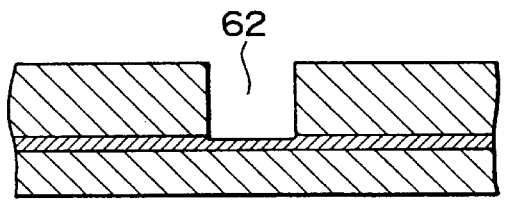
Figure 6C:
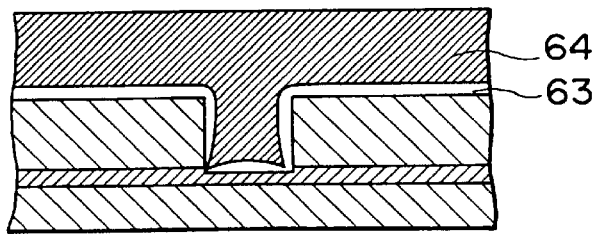
Figure 6D:
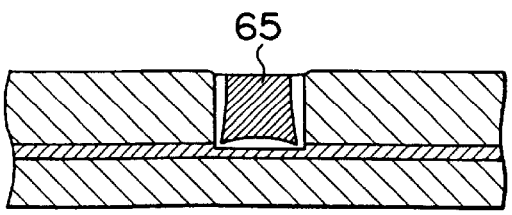
Figure 7A:
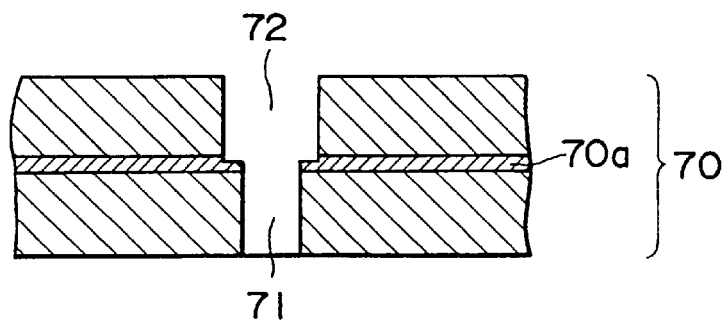
FIGS. 7A to 7C are views showing sequential steps of a general dual damascene interconnection process.
Figure 7B:
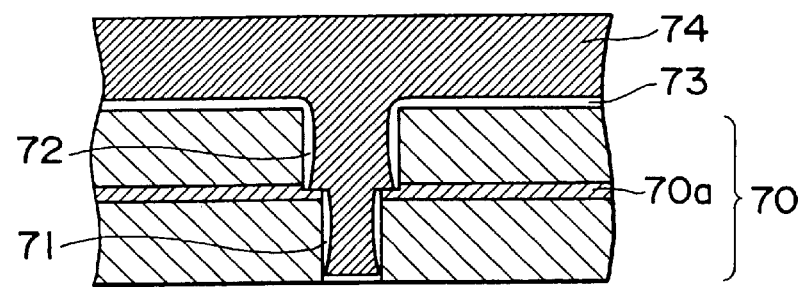
Figure 7C:
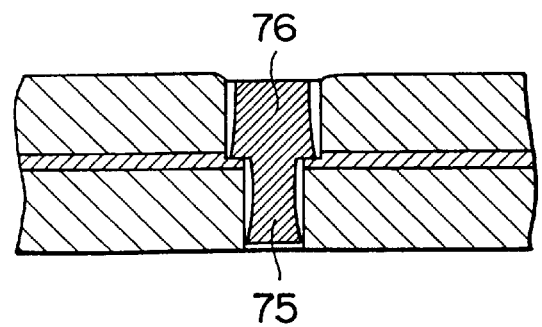
Figure 8:
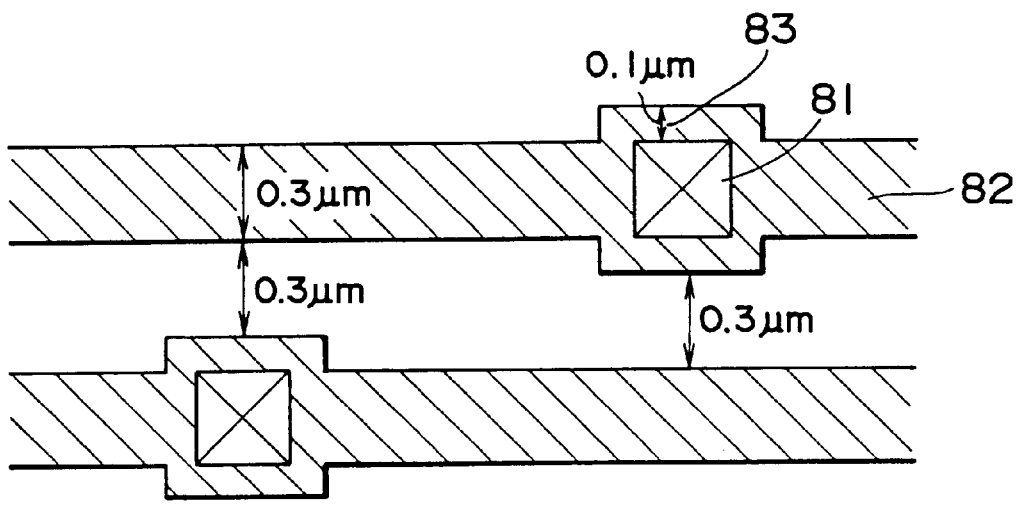
FIG. 8 is a diagram showing a general interconnection layout provided with a misalignment margin.
Figure 9:
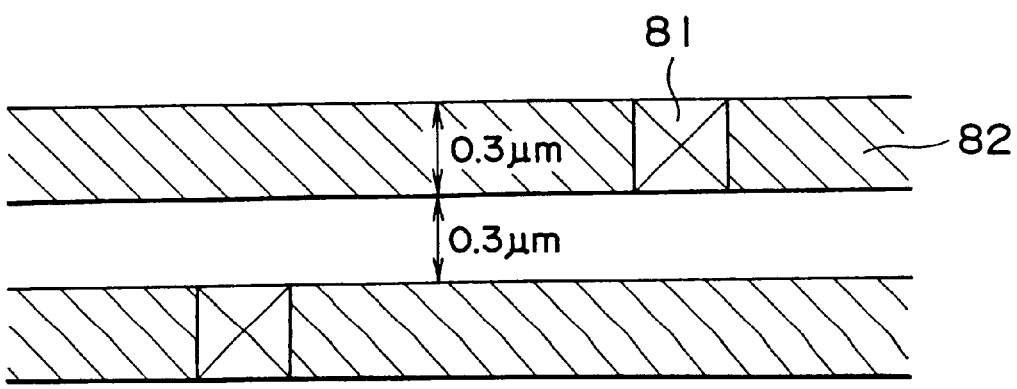
FIG. 9 is a diagram showing a layout of a borderless connection hole structure.
Figure 11A:
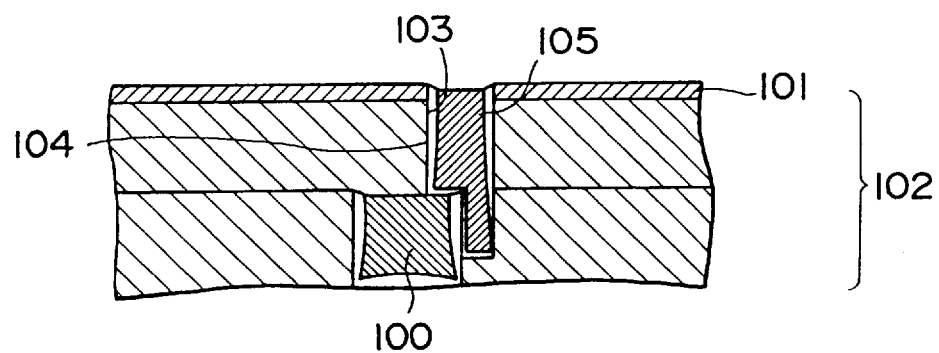
Figure 11B:
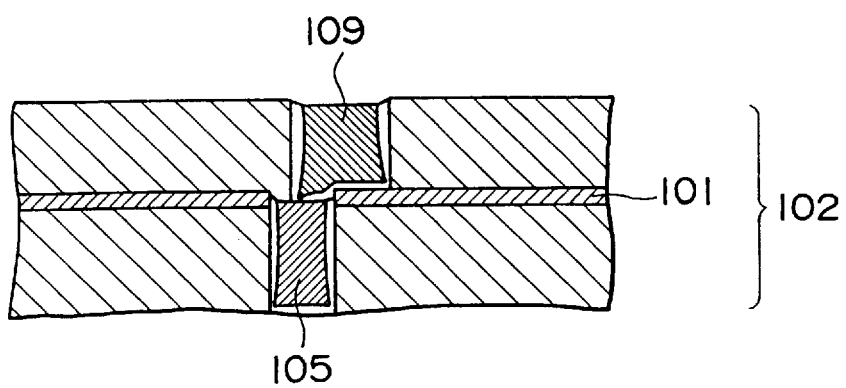

(F) (See FIG. 5F)

After formation the Al—Cu layer 58a, the Al—Cu layer 58a was made to reflow in the trench 56 by heat-treatment in an insert gas atmosphere at a high pressure (high pressure reflow process).

Then, the Al—Cu layer 58a and the backing film 57 (TiN/Ti film) were perfectly removed except for part of the Al—Cu layer 58a and the backing film 57 present in the trench 56, to trench interconnection 58. Thus, a semiconductor device having a structure shown in FIG. 5F was obtained. In addition, an upper surface of the trench interconnection 58 made from Cu is preferably capped with a film not containing oxygen such as SiN.

High Pressure Reflow Condition

Ar gas pressure: $10^6$ Pa or more
heating time: 2 min
substrate heating temperature: 450° C.

In the semiconductor device thus obtained, even in the case where the trench 56 was partially offset from the via-hole 53, a large increase in contact resistance therebetween could be avoided because the upper and side surfaces of the connection plug 55 buried in the via-hole 53 were in contact with the upper trench interconnection 58.

Although in Examples 1 and 2, the etching stopper layer is provided in the insulating film, it may be omitted. In this case, the depth of the trench can be adjusted by control of an etching time upon formation of the trench. Further, the tungsten plug may be replaced with an Al based plug.

While the preferred embodiments of the present invention have been described, such description is for illustrative purposes only, and it is to be understood that changes and variations may be made without departing from the spirit or scope of the following claims.

What is claimed is:

1. A semiconductor device comprising:

a substrate;

an interlayer insulating film formed on said substrate, said interlayer insulating film comprising an etching stop layer disposed between upper and lower insulating layers;

a connection hole formed in said interlayer insulating film through said upper and lower insulating layers and said etching stop layer;

a connection plug formed by burying said connection hole with a connection hole burying material, said connection plug comprising in cross section a rectangle extending between said upper and lower insulating layers;

a trench formed in said interlayer insulating film in said upper insulating layer; and a trench interconnection formed by burying said trench with an interconnection material;

wherein said connection plug enters in said trench interconnection in such a manner that at least part of a side surface of said connection plug is brought in contact with said trench interconnection in said trench.

2. A semiconductor device according to claim 1, wherein said connection plug passes through said trench interconnection and reaches a surface of said trench interconnection.

3. A semiconductor device according to claim 1, wherein an upper surface of said connection plug is positioned between a bottom portion of said trench interconnection and a surface of said trench interconnection.

4. A semiconductor device according to claim 1 wherein said connection plug is a tungsten plug or an aluminum plug formed by chemical vapor deposition (CVD).

5. A method of fabricating a semiconductor device, comprising:

a step (a) of forming an interlayer insulating film on a substrate, said interlayer insulating film comprising an etching strip layer formed between upper and lower insulating layers;

a step (b) of forming a connection hole in said insulating film through said upper and lower insulating layers and said etching stop layer;

a step (c) of burying said connection hole with a connection hole burying material to form a connection plug, said connection plug comprising in cross section a rectangle extending between said upper and lower insulating layers;

a step (d) of forming a trench in said insulating film in said upper insulating layer; and a step (e) of burying said trench with an interconnection material to form a trench interconnection;

wherein the formation of said trench in said step (d) is performed in such a manner that at least part of a side wall of said connection plug buried in said connection hole is exposed in said trench and brought into contact with said trench interconnection.

6. A method of fabricating a semiconductor device according to claim 5, wherein said etching stopper layer is a SiN (silicon nitride) layer.

7. A method of fabricating a semiconductor device, comprising:

a step (A) of forming an interlayer insulating film on a substrate, said interlayer insulating film comprising an etching strip layer formed between upper and lower insulating layers;

a step (B) of forming a connection hole in said insulating film through said upper and lower insulating layers and said etching stop layer;

a step (C) of burying said connection hole with a connection hole burying material to form a connection plug, said connection plug comprising in cross section a rectangle extending between said upper and lower insulating layers;

a step (D) of additionally forming an insulating film on said interlayer insulating film;

a step (E) of forming a trench in said insulating film and said first upper insulating layer of said interlayer insulating film; and a step (F) of burying said trench with an interconnection material to form a trench interconnection;

wherein the formation of said trench at said step (E) is performed in such a manner that at least part of a side wall of said connection plug buried in said connection hole at said step (C) is exposed in said trench and at least a side wall of said connection plug is brought into contact with said trench interconnection.

8. A method of fabricating a semiconductor device according to claim 7, wherein after said interlayer insulating film is formed, a surface of said upper insulating layer is planarized by chemical mechanical polishing (CMP).

9. A method of fabricating a semiconductor device according to claim 7, wherein said interlayer insulating film has a thickness sufficient to form said connection hole therein but insufficient to form said trench in said upper insulating layer.

10. A method of fabricating a semiconductor device according to claim 8, wherein said etching stopper layer is a SiN layer.

* * * * *